(12) United States Patent
Yu et al.

(10) Patent No.: US 9,761,826 B2
(45) Date of Patent: Sep. 12, 2017

(54) DISPLAY PANEL AND METHOD OF MANUFACTURING THE SAME, AND DISPLAY DEVICE

(71) Applicant: BOE Technology Group Co., Ltd., Beijing (CN)

(72) Inventors: Donghui Yu, Beijing (CN); Chun-Jan Wang, Beijing (CN); Huai-Ting Shih, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/906,319

(22) PCT Filed: May 4, 2015

(86) PCT No.: PCT/CN2015/078189
§ 371 (c)(1),
(2) Date: Jan. 20, 2016

(87) PCT Pub. No.: WO2016/107038
PCT Pub. Date: Jul. 7, 2016

(65) Prior Publication Data
US 2016/0329519 A1    Nov. 10, 2016

(30) Foreign Application Priority Data

Jan. 4, 2015    (CN) .......................... 2015 1 0002300

(51) Int. Cl.
*H01L 51/52* (2006.01)
*H01L 51/56* (2006.01)

(52) U.S. Cl.
CPC ...... *H01L 51/5246* (2013.01); *H01L 51/5259* (2013.01); *H01L 51/56* (2013.01)

(58) Field of Classification Search
CPC . H01L 51/5346; H01L 51/56; H01L 51/5259; H01L 51/5246
See application file for complete search history.

(56) References Cited

U.S. PATENT DOCUMENTS 7,700,958 B2 *  4/2010  Nishi ............... H01L 27/322
                                                257/100
9,065,021 B2    6/2015  Nagata et al.
(Continued)

FOREIGN PATENT DOCUMENTS

CN        1732715 A      2/2006
CN      103474561 A     12/2013
(Continued)

OTHER PUBLICATIONS

First Office Action, including Search Report, for Chinese Patent Application No. 201510002300.8, dated Apr. 25, 2016, 20 pages.
(Continued)

*Primary Examiner* — William Coleman
(74) *Attorney, Agent, or Firm* — Westman, Champlin & Koehler, P.A.

(57) ABSTRACT

Embodiments of the present disclosure relates to a display panel and a method of manufacturing the same, and a display device. The display panel comprises: a first substrate and a second substrate, at least one of which is provided with a first sealant, a second sealant and a third sealant; the first sealant is arranged at an outer side of the package region away from the display region, the second sealant is arranged inside the first sealant and at least within a peripheral region at a corner of the display region, and the third sealant is arranged inside the first sealant and fills the package region and the display region except parts thereof where the first sealant and the second sealant are arranged. With the display panel and the method of manufacturing the same, and the display device provided according to embodiments of the
(Continued)

present disclosure, the display panel can be appropriately packaged by providing water resistive and/or water absorptive materials outside corners of the display region, so that infiltration of external moisture into the display region to adversely affect display performance of the display region can be alleviated while ensuring light transmittance of the display region, thereby improving image display quality.

18 Claims, 3 Drawing Sheets

(56) References Cited

U.S. PATENT DOCUMENTS

| | | | |
|---|---|---|---|
| 9,362,523 | B2 | 6/2016 | Zhang |
| 2011/0249376 | A1 | 10/2011 | Wu |
| 2016/0035996 | A1 | 2/2016 | Sun et al. |

FOREIGN PATENT DOCUMENTS

| | | |
|---|---|---|
| CN | 103500755 A | 1/2014 |
| CN | 103682149 A | 3/2014 |
| CN | 203521418 U | 4/2014 |
| CN | 104218176 A | 12/2014 |
| CN | 104505470 A | 4/2015 |
| CN | 204289542 U | 4/2015 |

OTHER PUBLICATIONS

International Search Report and Written Opinion for International Application No. PCT/CN2015/078189, dated Sep. 28, 2015, 9 pages.

English translation of Box No. V. of the Written Opinion for the International Searching Authority for International Application No. PCT/CN2015/078189, 2 pages.

Second Office Action for Chinese Patent Application No. 201510002300.8, dated Oct. 19, 2016, 20 pages.

Third Office Action for Chinese Patent Application No. 201510002300.8, dated Mar. 9, 2017, 22 pages.

Fourth Office Action for Chinese Patent Application No. 201510002300.8, dated Jun. 28, 2017, 8 pages.

\* cited by examiner

DISPLAY PANEL AND METHOD OF MANUFACTURING THE SAME, AND DISPLAY DEVICE

CROSS-REFERENCE TO RELATED APPLICATION

This application is a Section 371 National Stage Application of International Application No. PCT/CN2015/078189, filed on 4 May 2016, entitled "Display Panel and Method of Manufacturing the Same, And Display Device", which has not yet been published, which claims the benefit of Chinese Patent Application No. 201510002300.8 filed on Jan. 4, 2015 in the State Intellectual Property Office of China, incorporated herein by reference in their entirety.

BACKGROUND OF THE INVENTION

Field of the Invention

Embodiments of the present disclosure relate to a display panel, a method of manufacturing the display panel and a display device.

Description of the Related Art

An organic electroluminescent device has advantageous characteristics such as active luminescence, wide angle of view, high contrast, quick response speed and the like, and thus is known as the new generation of display technology and gets more and more attention. The organic EL (Electroluminescent) device, however, is sensitive to external environment, especially side infiltration of moisture, which often results in attenuation in life of the device. Thus, an urgent problem to be solved is how to seal an OLED (Organic Light-Emitting Diode) device in order to effectively avoid side infiltration of moisture.

For example, for a top-emitting OLED device, a dam &fill type package structure (as shown in FIG. 1) which is more adjustable in gap is widely applied. However, it is required that filler used in the package structure has high light transmittance, which limits selection of materials for the filler. Many filler materials of high water resistance/water absorption could not be applied in conventional package structures due to their lower light transmittance. On the other hand, a filler material which has both of high light transmittance and high water resistance/water absorption is very rare. In addition, corners of a display region of a display panel are generally weak regions of the whole display panel and are susceptive to external environment. Thus, there is a need to construct appropriate and effective package structures by using different characteristics of materials.

SUMMARY OF THE INVENTION

Embodiments of the present disclosure provide a display panel, comprising a first substrate and a second substrate arranged to face each other, and a display region and a package region surrounding the display region formed between the first substrate and the second substrate, at least one of the first substrate and the second substrate being provided with a first sealant, a second sealant and a third sealant; wherein the first sealant is arranged at an outer side of the package region away from the display region so as to define an outer edge of the package region; the second sealant is arranged inside the first sealant and at least within a peripheral region at a corner of the display region; the third sealant is arranged inside the first sealant and fills the package region and the display region except parts thereof where the first sealant and the second sealant are arranged; the first substrate and the second substrate are sealed and bonded by the first sealant, second sealant and third sealant; the light transmittance of a material of the third sealant is greater than that of a material of the second sealant; and the water resistance ratio of the material of the second sealant is greater than that of a material of the third sealant, and/or the water absorption of the material of the second sealant is greater than that of the third sealant.

Optionally, both the second sealant and the third sealant abut the first sealant, and the second sealant abuts the third sealant.

Optionally, the second sealant is further arranged within the peripheral region at edges between every two adjacent corners of the display region.

Optionally, portions of the second sealant arranged within the peripheral region at the corners of the display region corner do not abut portions of the second sealant arranged within the peripheral region at edges between every two adjacent corners of the display region.

Optionally, the display region is a rectangular region, the package region is a rectangular ring region surrounding the display region, the first sealant forms an closed rectangular ring at an outer edge of the package region, and the second sealant at least comprises four discrete portions formed inside the first sealant and within the peripheral region at four corners of the display region.

Optionally, the second sealant further comprises four discrete portions formed inside the first sealant and within peripheral region at a middle portion of each of four edges of the display region.

Optionally, a length of each portion of the second sealant is ⅕ to 1/20 of a length of the edge of display region adjacent to the portion.

Optionally, the first sealant has a viscosity greater than 100,000 Pa*s

Optionally, the material of the first sealant includes acrylic optical cement or epoxy resin.

Optionally, the second sealant has a viscosity less than 5,000 Pa*s, and/or the third sealant has a viscosity less than 5,000 Pa*s.

Optionally, the water resistance ratio of the second sealant is greater than 80%.

Optionally, the material of the second sealant includes epoxy resin materials.

Optionally, the water absorption of the second sealant is greater than 80%.

Optionally, the material of the second sealant includes a metal oxide.

Optionally, a shape of a section of the second sealant taken in a thickness direction of the display panel includes a triangle, a sector, a strip shape, an L-shape or a reversed L-shape.

Embodiments of the present disclosure further provide a method of manufacturing the display panel as described above, the method comprising: providing a first sealant to at least one of a first substrate and a second substrate, wherein a display region and a package region surrounding the display region are formed between the first substrate and the second substrate, the first sealant is arranged at an outer side of the package region away from the display region so as to define an outer edge of the package region; providing a second sealant inside the first sealant and at least within a peripheral region at a corner of the display region; providing a third sealant inside the first sealant to fill the package region and the display region except parts thereof where the first sealant and the second sealant are arranged; and sealing and bonding the first substrate and the second substrate by the first sealant, second sealant and third sealant, wherein light transmittance of a material of the third sealant is greater than that of a material of the second sealant; and the water resistance ratio of the material of the second sealant is greater than that of the material of the third sealant, and/or the water absorption of the material of the second sealant is greater than that of the material of the third sealant.

Optionally, the first sealant is provided through a dispensing process.

Optionally, the second sealant and the third sealant are provided through an ink jet printing process or a dispensing process.

Embodiments of the present disclosure further provide a display device comprising any display panel as described above.

BRIEF DESCRIPTION OF THE DRAWINGS

Features and advantages of embodiments of the present disclosure will be more clearly understood by referring to accompanying drawings, which are illustrative but not limitative to the present disclosure and in which.

DETAINED DESCRIPTION OF PREFERRED EMBODIMENTS OF THE INVENTION

The present disclosure will be further described in detail in combination with exemplary embodiments with reference to the attached drawings, so that embodiments of the present disclosure could be more clearly understood. It is noted the embodiments and features in the embodiments of the present disclosure may be randomly combined when not conflicting with each other.

In the following detailed description, numerous specific details are set forth in order to provide a thorough understanding of the disclosed embodiments. It will be apparent, however, that the present disclosure may be practiced with other embodiments different from those described herein. Thus, scopes of the present disclosure are not limited by the following disclosed exemplary embodiments.

Figure 1:
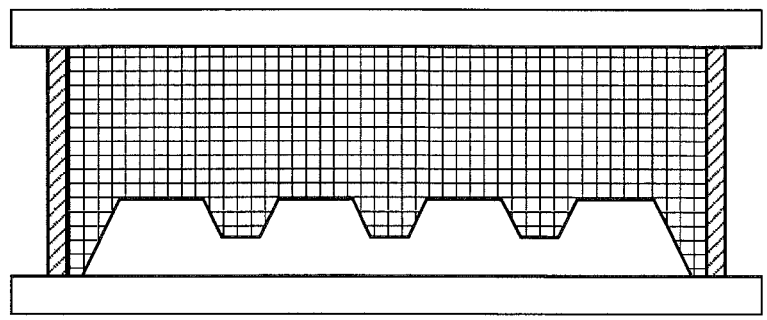
FIG. 1 is a structural schematic diagram showing a display panel in prior arts.
Figure 2:
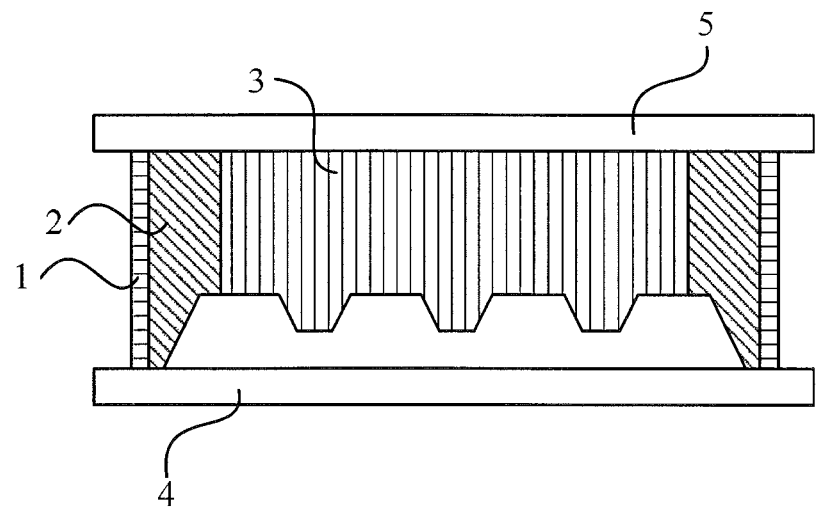
FIG. 2 is a structural schematic diagram showing a display panel according to one or more embodiments of the present disclosure.
Figure 3:
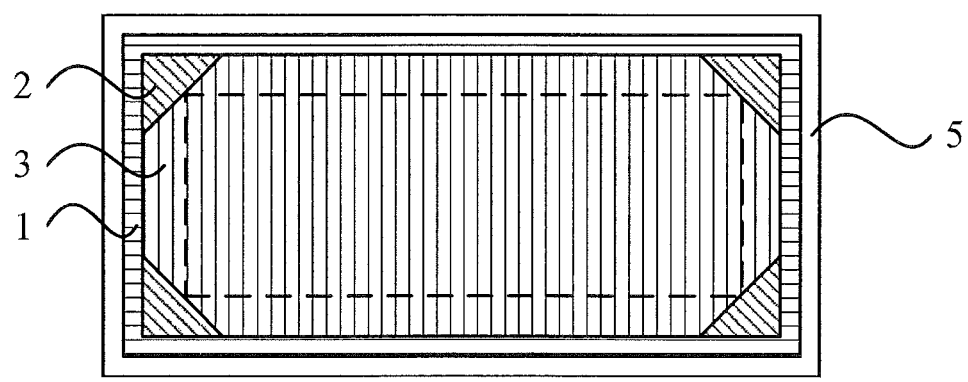
FIG. 3 is a plan view of the display panel shown in FIG. 2.

As shown in FIG. 2 and FIG. 3, there is provided a display panel according to one or more embodiments of the present disclosure, the display panel comprises a first substrate 4 and a second substrate 5 arranged to face each other, and a display region (for example, a region defined inside of a broken line frame shown in FIG. 3) and a package region (for example, a region defined outside of the broken line frame and inside a first sealant 1 shown in FIG. 3) surrounding the display region formed between the first substrate 4 and the second substrate 5, wherein at least one of the first substrate 4 and the second substrate 5 is provided with the first sealant 1, a second sealant 2 and a third sealant 3; wherein the first sealant 1 is arranged at an outer side of the package region away from the display region so as to define an outer edge of the package region; the second sealant 2 is arranged inside the first sealant and at least within a peripheral region (which is a portion of the package region) at a corner of the display region; the third sealant 3 is arranged inside the first sealant 1 and fills the package region and the display region except parts thereof where the first sealant 1 and the second sealant 2 are arranged; the first substrate 4 and the second substrate 5 are sealed and bonded by the first sealant 1, second sealant 2 and third sealant 3; wherein the light transmittance of a material of the third sealant 3 is greater than that of a material of the second sealant 2; and the water resistance ratio of the material of the second sealant 2 is greater than that of a material of the third sealant 3, and/or the water absorption of the material of the second sealant 2 is greater than that of the third sealant 3.

The display panel may be an OLED panel; at this time, the first substrate may be an OLED array substrate, and the second substrate may be cover panel, for example. Of course, the display panel may also be other type of display panel where it is required to provide sealant(s) between two substrates.

The first sealant may correspond to a seal agent (Dam), which is not only used to define the package region, but also capable of effectively bonding the first substrate and the second substrate. According to one or more embodiments of the present disclosure, the first sealant may be doped therein with dopant, such as silicon oxide or aluminum oxide, so as to improve elasticity and bonding capacity of the first sealant.

Although the first sealant can partially block moisture, there is a case where external moisture infiltrates into the display region, and such infiltration is more serious at corner portions of the display region. The third sealant located inside the first sealant (and thus corresponding to filler) can not provide higher water resistance or water absorption because it has to provide higher light transmittance. The external moisture can be effectively prevented from infiltrating into the display region by providing the second sealant having high water resistance or water absorption outside the corners of the display region.

Further, since the package region does not display any image and there are wirings within the package region, the second sealant, which is arranged within package region between the first sealant and the display region, will not adversely affect the light transmittance of the display region. Thereby, infiltration of external moisture into the display region to adversely affect display performance of the display region can be alleviated while ensuring light transmittance of the display region, improving image display quality.

It is noted that the rectangular display panel shown in FIG. 3 is only one optional structure for the display panel in embodiments of the present disclosure, and in practice, other shaped display panels may be provided as desired. The drawings are only intended to clearly shown relative position relationships among various portions of the structure, but not limitative to proportion relationships, shapes and the like. In actual applications, the number and position of the second sealant may be provided particularly as required, for example, the second sealant may has an L shape or inverted L shape completely surrounding four corner of the rectangular shape. Further, when the first substrate is an OLED array substrate, structures such as a thin film transistor, an organic electroluminescent element, a transparent electrode and the like may be provided, for example.

Optionally, both the second sealant 2 and the third sealant 3 abut the first sealant 1, and the second sealant 2 abuts the third sealant 3.

The second sealant and the third sealant are arranged to contact the first sealant, and the second sealant is arranged to contact the third sealant, so that any spacing can be avoided from being formed between various sealants, the structural firmness of the display panel is improved, and infiltration of external impurity through the sealants can be avoided.

Figure 4:
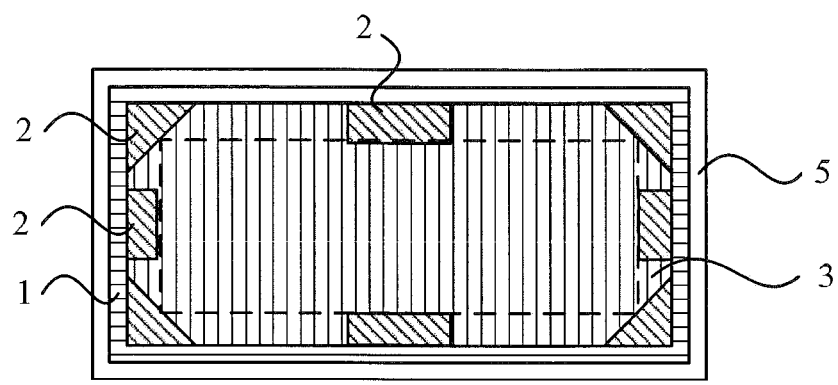
FIG. 4 is a structural schematic diagram showing a display panel according to one or more embodiments of the present disclosure.

As shown in FIG. 4, optionally, the second sealant 2 is further arranged within the peripheral region at edges between every two adjacent corners of the display region.

Optionally, portions of the second sealant 2 arranged within the peripheral region at the corners of the display region corner do not abut portions of the second sealant 2 arranged within the peripheral region at edges between every two adjacent corners of the display region.

Optionally, the display region is a rectangular region, the package region is a rectangular ring region surrounding the display region, the first sealant 1 forms an closed rectangular ring at an outer edge of the package region, and the second sealant 2 at least comprises four discrete portions formed inside the first sealant and within regions outside four corners of the display region.

Optionally, the second sealant 2 further comprises four discrete portions formed inside the first sealant 1 and within region outside a middle portion of each of four edges of the display region.

Optionally, in the display region, in addition to corner portions through which moisture easily infiltrates, other portions through which moisture easily infiltrates includes portions between two adjacent corners, and the moisture will more easily infiltrate through portions nearer to middle points of respective edges of the display region. Obstruction capability of the display region to external moisture will be further improved by providing the second sealant at the portions nearer to the middle points. Specifically, the length and thickness of portions of the second sealant corresponding to respective edges of the display region may be set as required; optionally, the length may be 1/10 of that of a corresponding edge of the display region, and the thickness may be equal to the width of the package region.

It is noted that the rectangular display panel shown in FIG. 4 is only one preferred structure for the display panel in embodiments of the present disclosure, and in practice, other shaped display panels may be provided as desired. Further, second sealant may be optionally arranged at the middle portions of respective edges. Of course, the second sealant may be also arranged at other positions as desired.

Optionally, the first sealant 1 has a viscosity greater than 100,000 Pa*s.

Optionally, the material of the first sealant 1 includes acrylic optical cement or epoxy resin.

Optionally, the material having a higher viscosity is used to define the package region, so that the first substrate and the second substrate can be bonded firmly by using the first sealant so as to improve structural stability of the display panel.

Optionally, the second sealant has a viscosity less than 5,000 Pa*s, and/or the third sealant has a viscosity less than 5,000 Pa*s. Optionally, the material having a lower viscosity is used to fill the display region, so that it can be ensured that the display region has higher light transmittance.

Optionally, the water resistance ratio of the second sealant is greater than 80%.

Optionally, the material of the second sealant includes epoxy resin materials.

Optionally, the water absorption of the second sealant is greater than 80%.

Optionally, the material of the second sealant includes a metal oxide.

Herein, the viscosity generally refers to a resistance generated when two regions, which are taken from the sealant at the normal temperature (generally 25° C.) and respectively have an area of 1 m$^2$, are spaced apart from each other by a spacing of 1 m and moved at a relative speed of 1 m/s, with the unit being Pa*s; the water absorption generally refers to an added weight percentage of a substance after the substance is placed within water for a time period (which, specifically, may be from ten seconds to ten hours) at a certain temperature (generally, at the normal temperature of 25° C.); and water resistance ratio generally refers to a proportion of moisture which does not infiltrate through a material within a unit time to the whole moisture under one atmospheric pressure and at the normal temperature (generally 25° C.).

Of course, optionally in addition to the above materials, other materials may be also selected as actually required.

Optionally, a shape of a section of the second sealant 2 taken in a thickness direction of the display panel includes a triangle, a sector or a strip shape. Generally speaking, the water permeability at the corner portion of the display region corner has a descending distribution from a top point of the corner portion to two edges at the corner portion, thus the sealant may be formed with a triangular (preferably, isosceles triangular) section, so that a thicker water resistive layer and/or water absorptive layer is formed at the top point, and the thickness of the water resistive layer and/or water absorptive layer is gradually decreased in directions in which the two edges extend, thereby water resistance performance of the display region is ensured while saving material.

Figure 5:
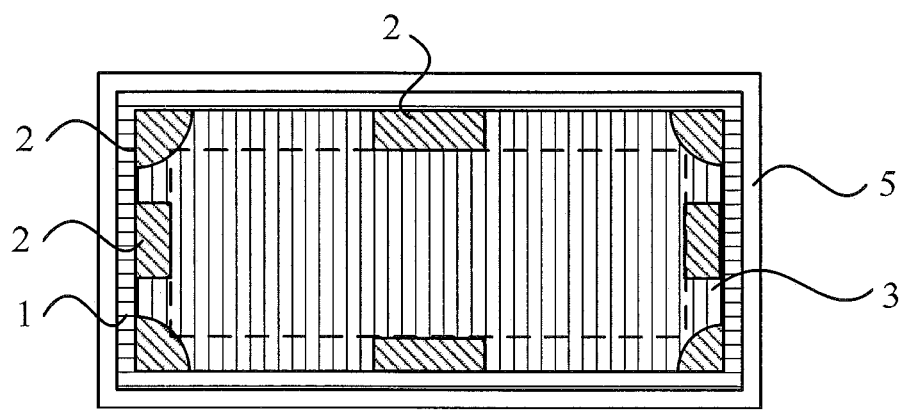
FIG. 5 is a structural schematic diagram showing a display panel according to one or more embodiments of the present disclosure.

It is noted that although a triangular second sealant is shown in the plan view, the second sealant is a prism having a triangular section in practice structure. The triangular shape is only one optional form in embodiments of the present disclosure, and the shape of the second sealant 2 may be set according to specific requirements, for example, the section may be also a sector, as shown in FIG. 5. The section of the second sealant 2 taken in the thickness direction may have an L-shape or a reversed L-shape so as to surround the four corner of the display region in a better way. Shapes and sizes of respective sealants are not limited in embodiments of the present disclosure.

Figure 6:
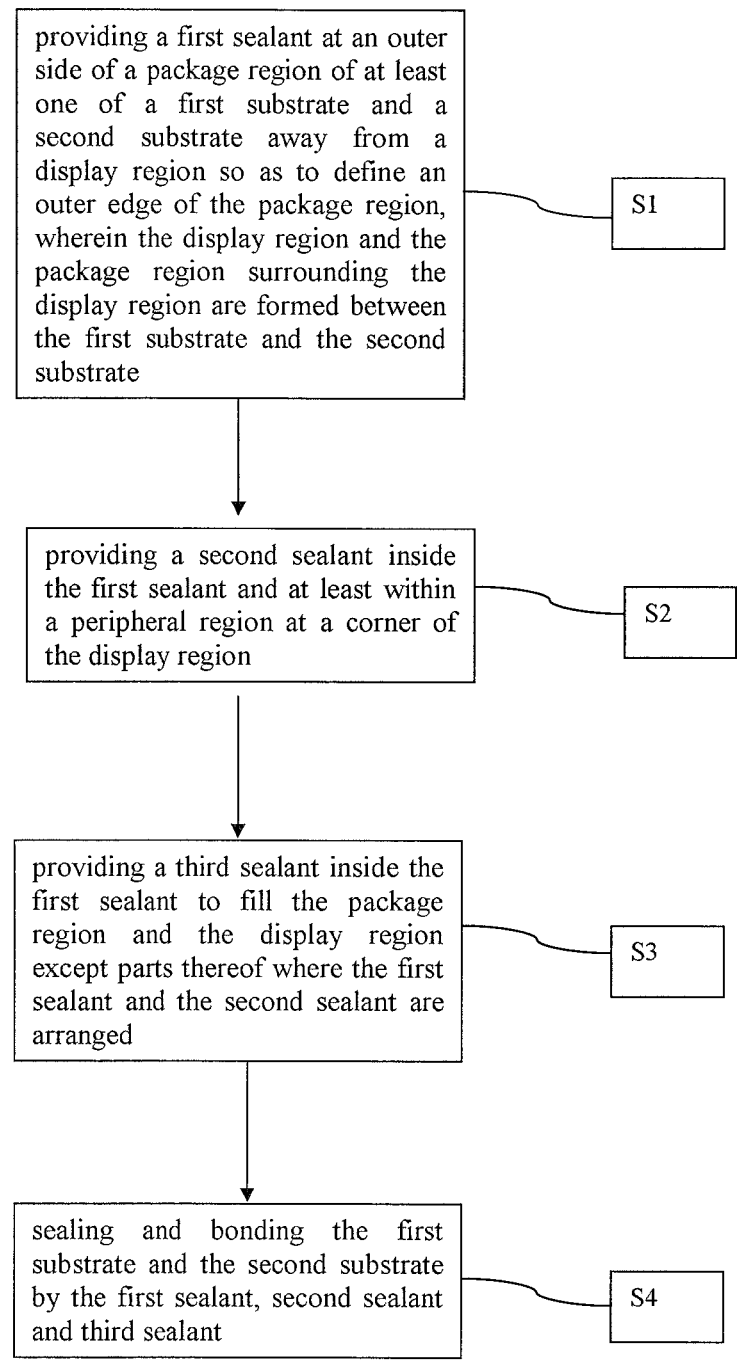
FIG. 6 is a schematic flowchart showing a method of manufacturing a display panel according to one or more embodiments of the present disclosure.

As shown in FIG. 6, embodiments of the present disclosure further provide a method of manufacturing a display panel, comprising:

S1, providing a first sealant at an outer side of a package region of at least one of a first substrate and a second substrate away from a display region so as to define an outer edge of the package region, wherein the display region and the package region surrounding the display region are formed between the first substrate and the second substrate;

S2, providing a second sealant inside the first sealant and at least within a peripheral region at a corner of the display region;

S3, providing a third sealant inside the first sealant to fill the package region and the display region except parts thereof where the first sealant and the second sealant are arranged;

S4, sealing and bonding the first substrate and the second substrate by the first sealant, second sealant and third sealant, wherein light transmittance of a material of the third sealant is greater than that of a material of the second sealant; and the water resistance ratio of the material of the second sealant is greater than that of the material of the third sealant, and/or the water absorption of the material of the second sealant is greater than that of the material of the third sealant.

Optionally, the first sealant is provided through a dispensing process. The dispensing process (Dispenser) is easily operated so as to facilitate arrangement of the first sealant.

Optionally, the second sealant and the third sealant are provided through an ink jet printing process or a dispensing process. A sealant having a fixed shape may be easily formed through the ink jet printing (IJP) process, so that the second sealant and the third sealant are arranged to have different shapes at different positions within the display region as required.

Embodiments of the present disclosure further provide a display device comprising the display panel according to any one of the embodiments as described above.

The display device in embodiments of the present disclosure may be an electronic paper, a mobile phone, a tablet computer, a TV set, a notebook PC, a digital picture frame, a navigator or any other product or component having a display function.

The technique solutions of the embodiments of the present disclosure have been described in detail with reference to the drawings. In related arts, in order to ensure light transmittance of the display region of the display panel, it is difficult to provide a higher water resistance performance for the display region. With technique solutions of the embodiments of the present disclosure, the display panel can be appropriately packaged by providing water resistive and/or water absorptive materials outside corners of the display region, so that infiltration of external moisture into the display region to adversely affect display performance of the display region can be alleviated while ensuring light transmittance of the display region, thereby improving image display quality.

In the embodiments of the present disclosure, terms "first", "second" and "third" are only intended for description purpose, but could not be understood as indicating or implying relative importance. Term "a plurality of" refers to two or more, unless otherwise expressly defined.

The above described contents are only preferred embodiments of the present disclosure, and are not intended to limit the present disclosure. Various modification and changes may be made to the embodiments of the present disclosure by those skilled in the art. All changes, alternatives or modifications which are made within the principles and spirit of the present disclosure should fall within the scopes of the present invention.

What is claimed is:

1. A display panel, comprising a first substrate and a second substrate arranged to face each other, and a display region and a package region surrounding the display region formed between the first substrate and the second substrate, at least one of the first substrate and the second substrate being provided with a first sealant, a second sealant and a third sealant; wherein the first sealant is arranged at an outer side of the package region away from the display region so as to define an outer edge of the package region;

the second sealant is arranged inside the first sealant and at least within a peripheral region at a corner of the display region;

the third sealant is arranged inside the first sealant and fills the package region and the display region except parts thereof where the first sealant and the second sealant are arranged;

the first substrate and the second substrate are sealed and bonded by the first sealant, second sealant and third sealant;

the light transmittance of a material of the third sealant is greater than that of a material of the second sealant; and the water resistance ratio of the material of the second sealant is greater than that of a material of the third sealant, and/or the water absorption of the material of the second sealant is greater than that of the third sealant;

the water resistance ratio of the second sealant is greater than 80%, and/or the water absorption of the second sealant is greater than 80%.

2. The display panel according to claim 1, wherein both the second sealant and the third sealant abut the first sealant, and the second sealant abuts the third sealant.

3. The display panel according to claim 1, wherein the second sealant is further arranged within the peripheral region at edges between every two adjacent corners of the display region.

4. The display panel according to claim 1, wherein the display region is a rectangular region, the package region is a rectangular ring region surrounding the display region, the first sealant forms an closed rectangular ring at an outer edge of the package region, and the second sealant at least comprises four discrete portions formed inside the first sealant and within the peripheral region at four corners of the display region.

5. The display panel according to claim 1, wherein the first sealant has a viscosity greater than 100,000 Pa*s.

6. The display panel according to claim 1, wherein the second sealant has a viscosity less than 5,000 Pa*s, and/or the third sealant has a viscosity less than 5,000 Pa*s.

7. The display panel according to claim 1, wherein the material of the second sealant includes epoxy resin materials.

8. The display panel according to claim 1, wherein the material of the second sealant includes a metal oxide.

9. The display panel according to claim 1, wherein a shape of a section of the second sealant taken in a thickness direction of the display panel includes a triangle, a sector, a strip shape, an L-shape or a reversed L-shape.

10. A display device, comprising the display panel according to claim 1.

11. The display panel according to claim 2, wherein the second sealant is further arranged within the peripheral region at edges between every two adjacent corners of the display region.

12. The display panel according to claim 3, wherein portions of the second sealant arranged within the peripheral region at the corners of the display region corner do not abut portions of the second sealant arranged within the peripheral region at edges between every two adjacent corners of the display region.

13. The display panel according to claim 4, wherein the second sealant further comprises four discrete portions formed inside the first sealant and within peripheral region at a middle portion of each of four edges of the display region.

14. The display panel according to claim 4, wherein a length of each portion of the second sealant is 1/5 to 1/20 of a length of the edge of display region adjacent to the portion.

15. The display panel according to claim 5, wherein the material of the first sealant includes acrylic optical cement or epoxy resin.

16. A method of manufacturing a display panel according to claim 1, comprising:
 providing a first sealant to at least one of a first substrate and a second substrate, wherein a display region and a package region surrounding the display region are formed between the first substrate and the second substrate, the first sealant is arranged at an outer side of the package region away from the display region so as to define an outer edge of the package region;
 providing a second sealant inside the first sealant and at least within a peripheral region at a corner of the display region;
 providing a third sealant inside the first sealant to fill the package region and the display region except parts thereof where the first sealant and the second sealant are arranged; and
 sealing and bonding the first substrate and the second substrate by the first sealant, second sealant and third sealant,
 wherein light transmittance of a material of the third sealant is greater than that of a material of the second sealant; and
 the water resistance ratio of the material of the second sealant is greater than that of the material of the third sealant, and/or the water absorption of the material of the second sealant is greater than that of the material of the third sealant;
 the water resistance ratio of the second sealant is greater than 80%, and/or the water absorption of the second sealant is greater than 80%.

17. The method according to claim 16, wherein the first sealant is provided through a dispensing process.

18. The method according to claim 16, wherein the second sealant and the third sealant are provided through an ink jet printing process or a dispensing process.

* * * * *